United States Patent
Sankaranarayanan et al.

(10) Patent No.: US 9,984,741 B2
(45) Date of Patent: May 29, 2018

(54) SYSTEM AND METHOD OF TRANSFERRING DATA OVER AVAILABLE PINS

(71) Applicant: Dell Products, LP, Round Rock, TX (US)

(72) Inventors: Vadhiraj Sankaranarayanan, Austin, TX (US); Stuart Allen Berke, Austin, TX (US); Bhyrav M. Mutnury, Round Rock, TX (US)

(73) Assignee: DELL PRODUCTS, LP, Round Rock, TX (US)

( * ) Notice: Subject to any disclaimer, the term of this patent is extended or adjusted under 35 U.S.C. 154(b) by 155 days.

(21) Appl. No.: 14/933,270

(22) Filed: Nov. 5, 2015

(65) Prior Publication Data

US 2017/0133082 A1   May 11, 2017

(51) Int. Cl.
| | |
|---|---|
| *G06F 11/14* | (2006.01) |
| *G11C 11/4093* | (2006.01) |
| *G11C 11/4076* | (2006.01) |
| *G11C 29/52* | (2006.01) |
| *G06F 11/07* | (2006.01) |
| *G11C 7/02* | (2006.01) |
| *G11C 7/10* | (2006.01) |
| *G11C 5/00* | (2006.01) |
| *G06F 13/16* | (2006.01) |
| *G11C 29/02* | (2006.01) |
| *G11C 29/00* | (2006.01) |

(52) U.S. Cl.
CPC ........ *G11C 11/4093* (2013.01); *G06F 11/073* (2013.01); *G06F 11/079* (2013.01); *G06F 11/0754* (2013.01); *G06F 11/0793* (2013.01); *G06F 13/1668* (2013.01); *G11C 5/005* (2013.01); *G11C 7/02* (2013.01); *G11C 7/1066* (2013.01); *G11C 11/4076* (2013.01); *G11C 29/022* (2013.01); *G11C 29/023* (2013.01); *G11C 29/025* (2013.01); *G11C 29/52* (2013.01); *G11C 29/702* (2013.01)

(58) Field of Classification Search
CPC ............ G11C 11/4093; G11C 11/4076; G06F 11/073; G06F 11/0754; G06F 11/079
USPC ........................................................ 714/6.2
See application file for complete search history.

(56) References Cited

U.S. PATENT DOCUMENTS

| | | | |
|---|---|---|---|
| 8,291,153 B2 | 10/2012 | Berke et al. | |
| 2004/0105292 A1* | 6/2004 | Matsui ................ | G06F 13/4243 365/63 |
| 2007/0257693 A1* | 11/2007 | Stott ................ | G01R 31/31716 324/750.3 |
| 2010/0199017 A1* | 8/2010 | Hollis ................. | G06F 11/1008 710/316 |
| 2012/0099383 A1* | 4/2012 | Kim ..................... | G11C 7/1057 365/189.02 |

(Continued)

*Primary Examiner* — Kamini B Patel
(74) *Attorney, Agent, or Firm* — Larson Newman, LLP

(57) ABSTRACT

A system includes a memory device and a memory controller. The memory device has a data pin and a first available pin. The memory controller has a data pin coupled to the data pin of the memory device, and has a first available pin coupled to the first available pin of the memory device. The memory controller transfers memory data on the first available pin of the memory controller, and the memory device receives memory data on the first available pin of the memory device.

18 Claims, 8 Drawing Sheets

(56) References Cited

U.S. PATENT DOCUMENTS

| | | | |
|---|---|---|---|
| 2012/0188833 A1* | 7/2012 | Yamahara | G11C 7/1072 365/193 |
| 2012/0326746 A1* | 12/2012 | McCall | G11C 7/1045 326/30 |
| 2013/0059471 A1* | 3/2013 | Mongold | H01R 12/721 439/607.14 |
| 2013/0132660 A1 | 5/2013 | Li et al. | |
| 2013/0151767 A1 | 6/2013 | Berke et al. | |
| 2013/0166836 A1* | 6/2013 | Berke | G11C 7/1072 711/105 |
| 2013/0232372 A1* | 9/2013 | Sakamaki | G11C 5/04 713/500 |
| 2013/0252445 A1* | 9/2013 | Barr | H01R 13/6585 439/90 |
| 2013/0254506 A1 | 9/2013 | Berke et al. | |
| 2014/0122966 A1* | 5/2014 | Berke | G11C 5/14 714/758 |
| 2014/0181364 A1* | 6/2014 | Berke | G06F 13/16 711/103 |
| 2015/0023112 A1* | 1/2015 | Eom | H03K 19/0005 365/189.05 |

* cited by examiner

| DRAM Mode Register X | [7] | [6] | [5] | [4] | [3] | [2] | [1] | [0] |
|---|---|---|---|---|---|---|---|---|
| No Replacement | 0 | 0 | 0 | 0 | x | x | x | x |
| Replace DQS_t and DQS_c Mode | 0 | 0 | 0 | 0 | x | | | |
| Move DQS_t to TDQS_t and DQS_c to TDQS_c | 0 | 1 | 0 | 0 | x | x | x | x |
| Replace Data Bit Mode | 0 | 0 | 1 | 0 | | 000 = Data bit 0<br>001 = Data Bit 1<br>010 = Data Bit 2<br>011 = Data Bit 3<br>100 = Data Bit 4<br>101 = Data Bit 5<br>110 = Data Bit 6<br>111 = Data Bit 7 | | |
| Move Data Bit x to TDQS_t pin and tie TDQS_c to GND | 0 | 0 | 1 | 1 | x | | | |
| Data Bit Half Rate Mode | | | | | | | | |
| Split Data Bit x with TDQS_t pin and tie TDQS_c to GND. Data bit burst transfers occur at half signaling rate (Even bursts on Data Pin, Odd bursts on TDQS_t pin | 0 | 0 | 0 | 1 | x | 000 = Data bit 0<br>001 = Data Bit 1<br>010 = Data Bit 2<br>011 = Data Bit 3<br>100 = Data Bit 4<br>101 = Data Bit 5<br>110 = Data Bit 6<br>111 = Data Bit 7 | | |

*FIG. 9*

SYSTEM AND METHOD OF TRANSFERRING DATA OVER AVAILABLE PINS

FIELD OF THE DISCLOSURE

The present disclosure generally relates to information handling systems, and more particularly relates to transferring data over available pins.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination. The information handling system may also include dynamic random access memory (DRAM).

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which:

FIG. 9 is a chart of an example definition of a mode register according to an embodiment of the present disclosure.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
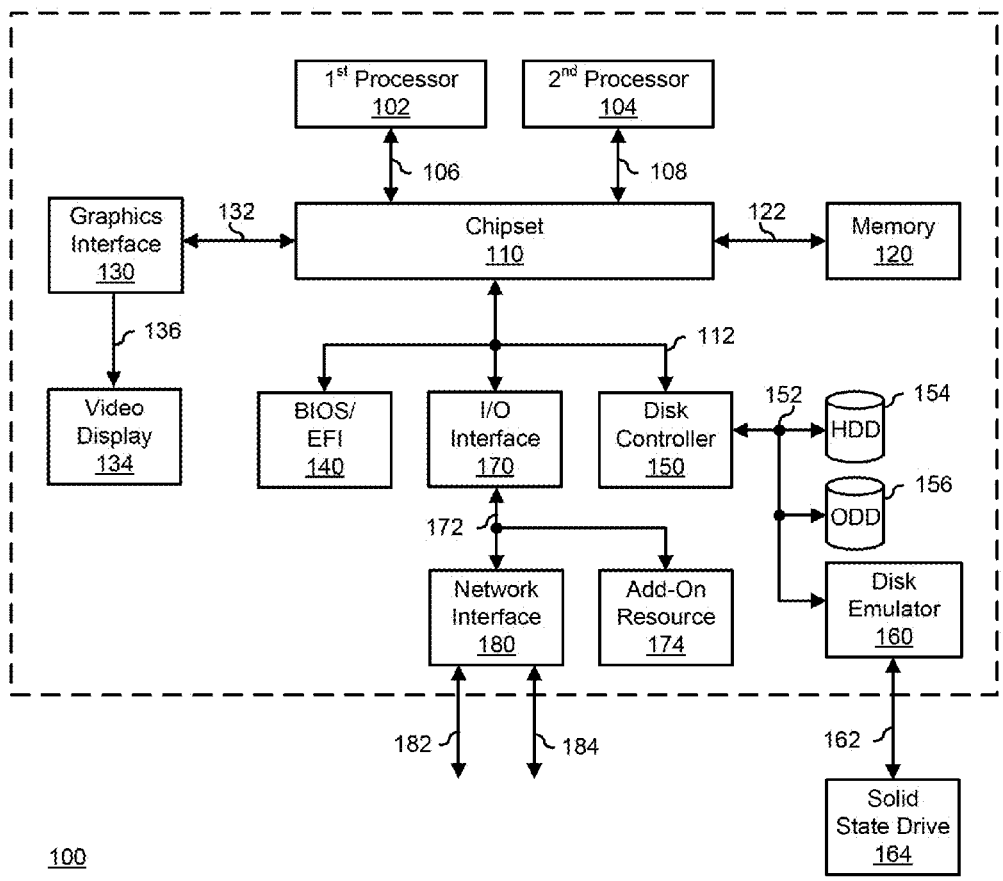
FIG. 1 is a block diagram illustrating an information handling system according to an embodiment of the present disclosure.

FIG. 1 illustrates a generalized embodiment of information handling system 100. For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 100 can include processing resources for executing machine-executable code, such as a central processing unit (CPU), a programmable logic array (PLA), an embedded device such as a System-on-a-Chip (SoC), or other control logic hardware. Information handling system 100 can also include one or more computer-readable medium for storing machine-executable code, such as software or data. Additional components of information handling system 100 can include one or more storage devices that can store machine-executable code, one or more communications ports for communicating with external devices, and various input and output (I/O) devices, such as a keyboard, a mouse, and a video display. Information handling system 100 can also include one or more buses operable to transmit information between the various hardware components.

Information handling system 100 can include devices or modules that embody one or more of the devices or modules described above, and operates to perform one or more of the methods described above. Information handling system 100 includes a processors 102 and 104, a chipset 110, a memory 120, a graphics interface 130, include a basic input and output system/extensible firmware interface (BIOS/EFI) module 140, a disk controller 150, a disk emulator 160, an input/output (I/O) interface 170, and a network interface 180. Processor 102 is connected to chipset 110 via processor interface 106, and processor 104 is connected to chipset 110 via processor interface 108. Memory 120 is connected to chipset 110 via a memory bus 122. Graphics interface 130 is connected to chipset 110 via a graphics interface 132, and provides a video display output 136 to a video display 134. In a particular embodiment, information handling system 100 includes separate memories that are dedicated to each of processors 102 and 104 via separate memory interfaces. An example of memory 120 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 140, disk controller 150, and I/O interface 170 are connected to chipset 110 via an I/O channel 112. An example of I/O channel 112 includes a Peripheral Component Interconnect (PCI) interface, a PCI-Extended (PCI-X) interface, a high-speed PCI-Express (PCIe) interface, another industry standard or proprietary communication interface, or a combination thereof. Chipset 110 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/EFI module 140 includes BIOS/EFI code operable to detect resources within information handling system 100, to provide drivers for the resources, initialize the resources, and access the resources. BIOS/EFI module 140 includes code that operates to detect resources within information handling system 100, to provide drivers for the resources, to initialize the resources, and to access the resources.

Disk controller 150 includes a disk interface 152 that connects the disc controller to a hard disk drive (HDD) 154, to an optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits a solid-state drive 164 to be connected to information handling system 100 via an external interface 162. An example of external interface 162 includes a USB interface, an IEEE 1194 (Firewire) interface, a proprietary interface, or a combination thereof. Alternatively, solid-state drive 164 can be disposed within information handling system 100.

I/O interface 170 includes a peripheral interface 172 that connects the I/O interface to an add-on resource 174 and to network interface 180. Peripheral interface 172 can be the same type of interface as I/O channel 112, or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral channel 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on separate circuit board or add-in card disposed within information handling system 100, a device that is external to the information handling system, or a combination thereof.

Network interface 180 represents a NIC disposed within information handling system 100, on a main circuit board of the information handling system, integrated onto another component such as chipset 110, in another suitable location, or a combination thereof. Network interface device 180 includes network channels 182 and 184 that provide interfaces to devices that are external to information handling system 100. In a particular embodiment, network channels 182 and 184 are of a different type than peripheral channel 172 and network interface 180 translates information from a format suitable to the peripheral channel to a format suitable to external devices. An example of network channels 182 and 184 includes InfiniBand channels, Fibre Channel channels, Gigabit Ethernet channels, proprietary channel architectures, or a combination thereof. Network channels 182 and 184 can be connected to external network resources (not illustrated). The network resource can include another information handling system, a data storage system, another network, a grid management system, another suitable resource, or a combination thereof.

The memory 120 is preferably double data rate 4 (DDR4) synchronous dynamic random access memory (SDRAM). DDR4 utilizes double data rate (DDR) signaling on its data signals, where two data bits are sent in each clock period to increase the data rate. Typically the DRAMs are mounted on a dual in-line memory module (DIMM). One or more DIMMs are inserted into sockets on the motherboard of the information handling system. The chipset 110 sends command signals to memory 120. The signals travel through conductors on the motherboard, through the socket to the DIMM, then through conductors on the DIMM before they reach the DRAM packages on the DIMM. The DRAM responds to the commands, and sends data back to the chipset 110 over the same conductors and socket. The extent to which the signals remain recognizable is known as signal integrity. The spacing and shape of the conductors affect the signal integrity.

Figure 2:
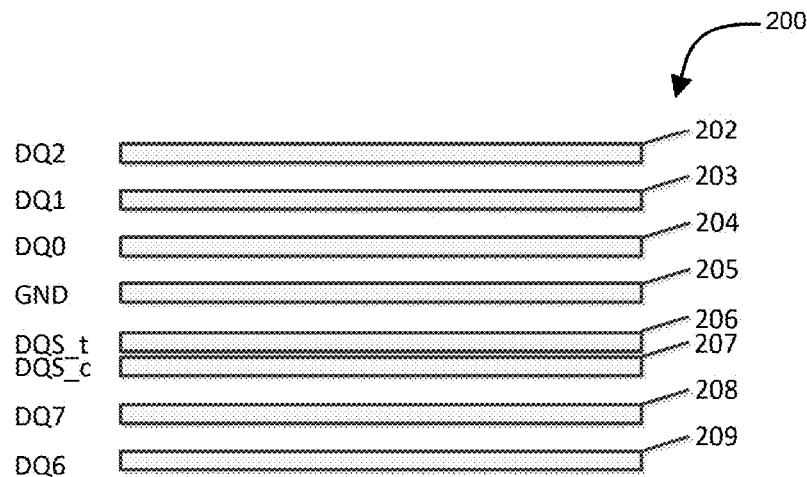
FIG. 2 is a schematic view of conductors of the information handling system.

FIG. 2 shows a group of conductors 200. Electromagnetic interference (EMI) along with capacitive and inductive coupling can cause signals on one conductor to adversely affect other conductors through a phenomenon known as crosstalk. Interference generally worsens as signaling rates increase, and so crosstalk generally increases with the adoption of DDR4, as it involves higher clock rates and signaling rates than previous standards. Because all signals should meet their desired timing in the presence of crosstalk, it is desirable that crosstalk be minimized. For example, conductor 202 carries a signal DQ2, and when the signal on that conductor changes, it will induce changes on nearby conductor 203 that carries signal DQ1. The induced changes will impact the signal quality of DQ1 from reaching its needed voltage level in the time available. Conductor 203 also has nearby conductors 202 and 204, and changes on these conductors will also induce changes on conductor 203, further degrading its timing. In general, all signal changes affect nearby signals and are affected by other nearby signals. Conductor 204 will be affected by adjacent conductors 203 and 205. Conductor 205, however, carries the ground signal GND that does not change. Therefore conductor 204 receives less crosstalk than conductor 203. The unchanging GND shields conductor 204 to some extent. The conductor 206, carrying signal DQS_t, is similarly shielded by the GND signal.

Sometimes a signal is defined to be driven differentially on two conductors. Conductors 206 and 207 form a differential pair, to carry the DQS signal as pins DQS_t and DQS_c. In this case, as the DQS_t rises the DQS_c falls, and vice versa. This scheme reduces crosstalk coupling for several reasons. The partner conductor provides a close return current path for the other conductor, and having such return current path close to the source current path helps to reduce the crosstalk coupling.

DDR4 memory operates according to a standard promulgated by the JEDEC Solid State Technology Association. Some of the definitions of that standard provide features that are optional for the user. For example, Termination Data Strobe (TDQS) is a feature that, when enabled in certain DDR4 memories applies a termination resistance on the DDR4 package ball. This feature is only valid on memories with data buses eight bits wide. Data Bus Inversion (DBI) is a power saving technique that may be optionally enabled. The DDR4 data bus uses more power sending a 0 than a 1, due to characteristics of its pin driver. When enabled, the DBI technique counts the number of data bits that are 0 to be transferred on the parallel data bus. When more than half of the data bits are 0, it will not transfer the exact bits, but will invert all the bits and send the inverted bits across the bus.

The technique ensures that less than half of the bus will contain the 0s that use more power. The technique uses a separate signal line called DBI_n to tell the receiver that the data bits are inverted, so that the receiver may re-invert them and recover the correct data. Another optional feature is Data Mask (DM) that allows for selectively inhibiting of the write data. When enabled and signaled, DM will prevent a write operation from changing the data stored at that location. The three optional features TDQS, DBI, and DM all share the same package ball, for example ball A7. At most one of the three may be enabled. Standard DDR4 DIMMS will have conductors to carry a signal from the memory controller to ball A7. If none of these three features are enabled, then those conductors are surplus, and available for use. Recognizing the conductors as available can lead to an optimization.

There may be a data path with the worst crosstalk, and that crosstalk could limit the speed of operation, or increase the chance of an error. For example, conductor 203 has noisy neighbors and may have crosstalk that limits its operation. Conductor 206 has a rather smaller amount of crosstalk due to the shielding effect of the neighbor conductor 205 being connected to GND. One might choose to use conductor 206 to carry the DQ1 signal. Then conductor 203 would be unused, so that it might be connected to ground to provide shielding for its neighbors. Also, it may be the case that conductor 207 is surplus if, for example, it were originally intended to carry one of two of a differentially driven signal. Then conductor 207 may be connected to ground. In this way conductor 206 is shielded on both top and bottom, and would have a small amount of crosstalk. Reduced crosstalk may allow the system to meet its performance targets of clock speed and bandwidth.

Figure 3:
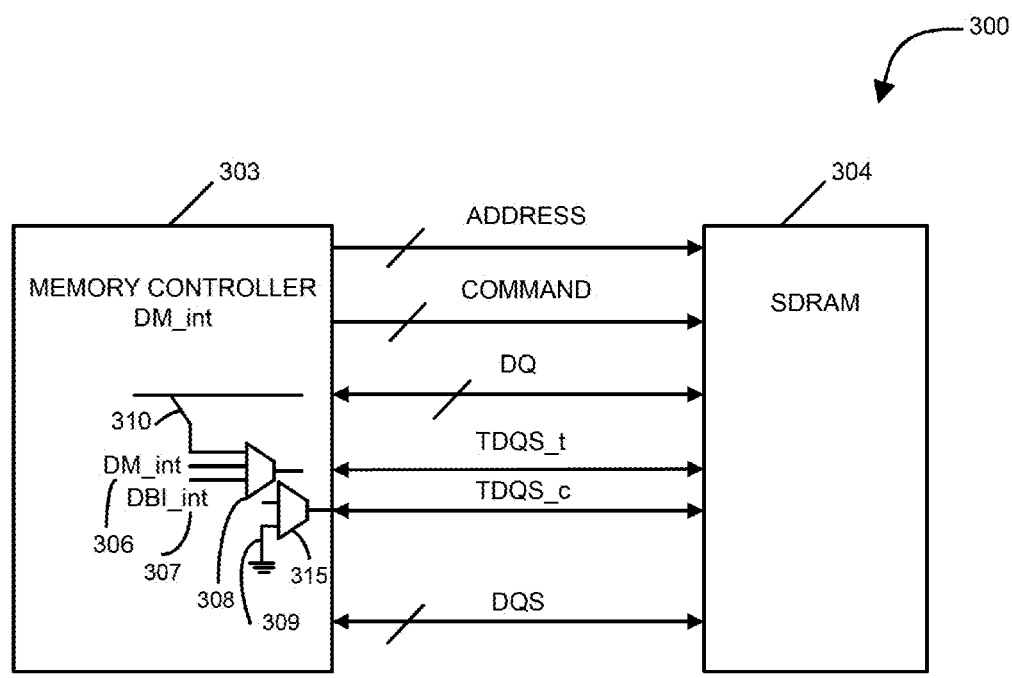
FIG. 3 is a schematic view of a memory controller and dynamic random access memory (DRAM) according to an embodiment of the present disclosure.

FIG. 3 illustrates conceptually the connections between memory controller 303 and SDRAM 304 in one embodiment of this disclosure. The address, command, DQ, TDQS, and DQS are all multi-bit busses, and some signals are omitted for brevity. Memory controller 303 connects to SDRAM 304. The conductors of the memory data bits are analyzed for crosstalk. One of those conductors may have relatively bad crosstalk, and may be replaced with a surplus conductor. A multiplexer 308 is inserted into the path that produces the TDQS_t output. The chosen memory bit with bad crosstalk 310 is selected by the multiplexer to come out the TDQS_t pin of the memory controller, instead of the internal signal DBI_int 307, or DM_int 306. Pin TDQS_c of the memory controller may be conditionally switched to ground 309 by multiplexer 315. The ground signal on the conductor of TDQS_c will help shield the conductor of TDQS_t. FIG. 3 shows the TDQS_t pin of the controller as an output for sake of illustration, but it should be understood that the TDQS_t pin is bi-directional. The incoming path would need to be altered also, in order to send the incoming memory data bit to the right place.

FIG. 3 shows an embodiment that uses two surplus conductors, TDQS_t and TDQS_c, with one used to carry the data bit and the other as a grounded shield. It should be appreciated in light of the current disclosure that there may be other ways to use the surplus conductors. A standard DDR4 SDRAM is not equipped to accept a data bit coming in the TDQS_t pin. The TDQS_t pin is currently specified as a multi-function pin; it can perform the DBI function, or a data mask function DM, or a TDQS function. The present disclosure adds a new function to that pin, namely transporting a data bit.

Figure 4:
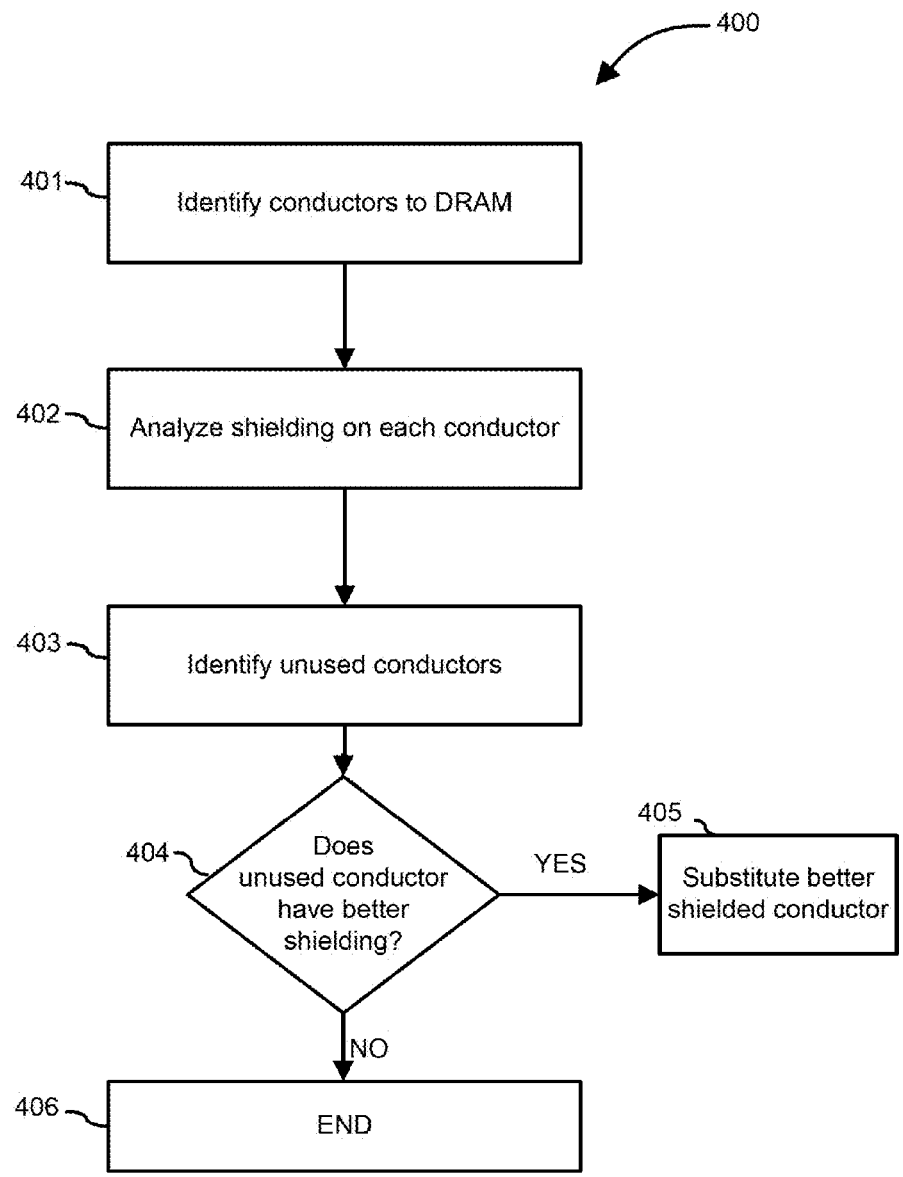
FIG. 4 is a flow diagram illustrating a method according to an embodiment of the present disclosure.

The method that leads to using the TDQS pin and conductor may be generalized. FIG. 4 shows a method 400 where the first step 401 is to identify the conductors to the DRAM. The layout of the entire signal path of each conductor is then analyzed in step 402. The proximity to other conductors is noted. The motherboard and DIMM cards may be modeled in a software simulation tool for electromagnetic interaction. Step 403 is to identify any unused conductors, which may be from optional features that are not implemented or enabled for the current memory configuration. In step 404, each of the unused conductors is considered as a replacement for a conductor in use. If the unused conductor has better shielding than the conductor in use, it may be substituted in place of the conductor in use. After considering the adoption of unused conductors, the method ends at step 406.

Figure 5:
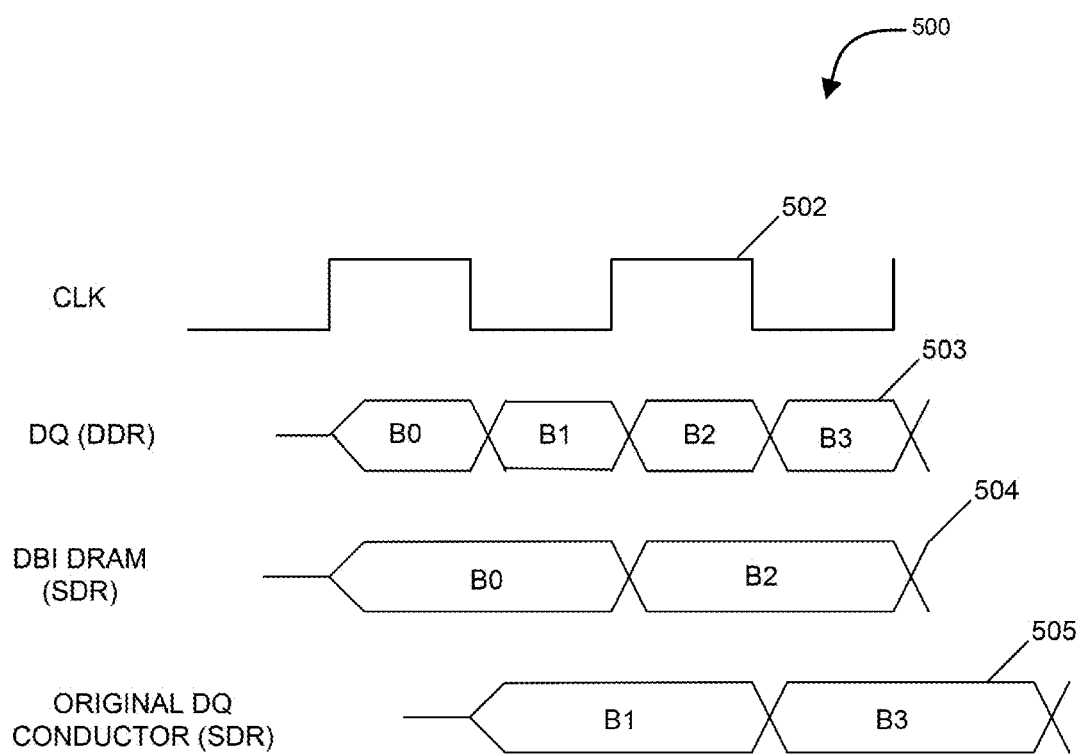
FIG. 5 is a timing diagram of one embodiment of the present disclosure.

FIG. 5 shows a timing diagram 500 of another embodiment. One could use two conductors to send single data rate data. The clock is shown as waveform 502. Data bits of DDR4 memory are transported at double data rate, which means two bits are sent each clock period, and the data changes at each clock change. Waveform 503 shows a normal DDR stream, with two bits sent in a clock period. The data stream could be partially de-multiplexed in time. Waveform 504 shows that B0 persists on the conductor for a full clock period. B1 is sent on another surplus conductor. Waveform 505 shows that it persists for a full clock period. This single data rate (SDR) data changes fewer times per clock, and that slower signaling rate typically leads to less EMI.

Figure 6:
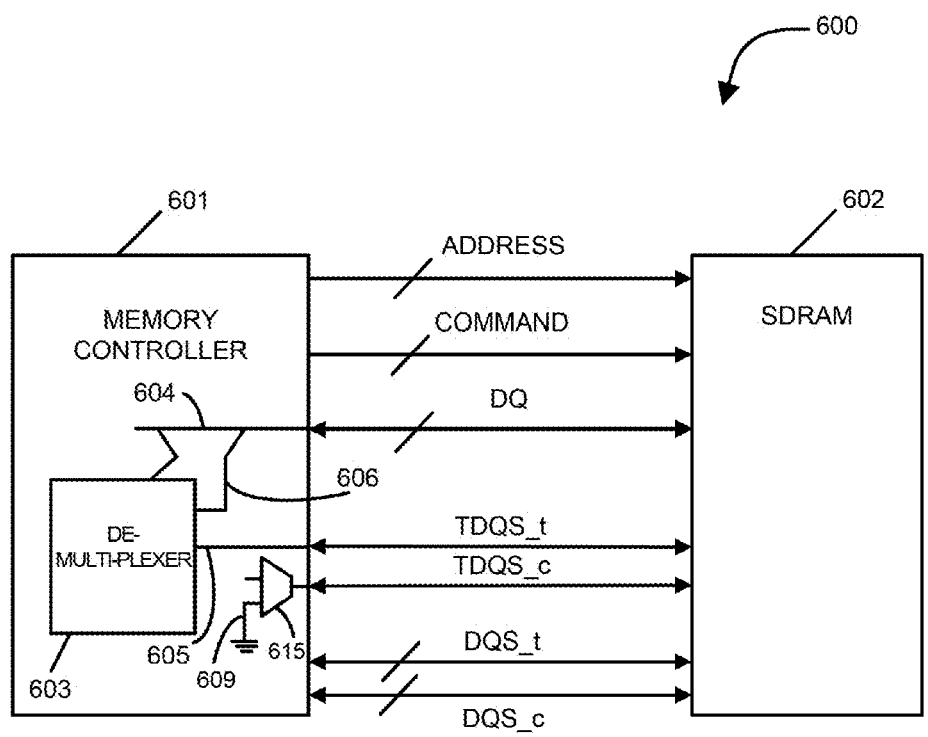
FIG. 6 is a schematic view of memory controller and DRAM according to another embodiment of the present disclosure.

FIG. 6 shows this embodiment as a connection 600. A de-multiplexer 603 inside the memory controller 601 achieves the waveforms of FIG. 5. The memory bits internal to the memory controller 604 are in double data rate mode, while signals 605 and 606 coming out of the de-multiplexer 603 are single data rate mode. The TDQS_c output may be conditionally switched to ground 609 by multiplexer 615. Again only the output direction is shown for simplicity. In practice, the incoming direction would be accommodated as well, requiring a multiplexer in time that is not shown.

Figure 7:
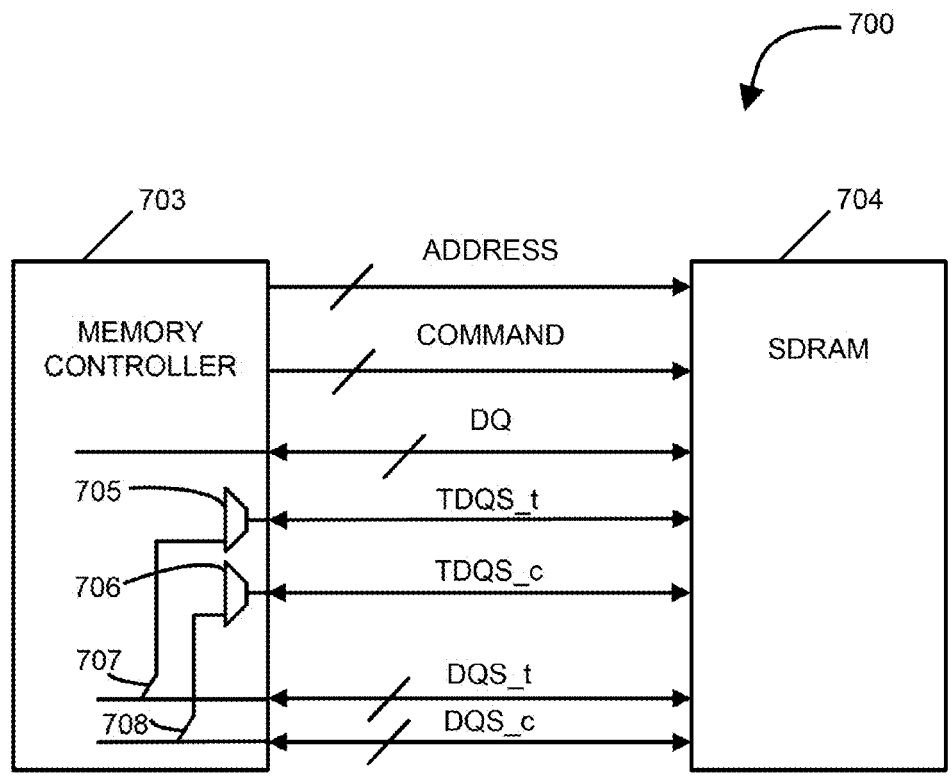
FIG. 7 is a schematic view of the memory controller and DRAM according to still another embodiment of the present disclosure.

FIG. 7 shows another way to use the surplus conductors, with connection 700. The data strobes DQS_t and DQS_c may encounter crosstalk or other signal integrity problem. The available conductors may be used to replace the differentially driven DQS_t and DQS_c. Memory controller 703 is connected to SDRAM 704. In this case, the memory controller uses multiplexer 705 to select the internal DQS_t 707 to come out the TDQS_t pin. Multiplexer 706 selects internal DQS_c 708 to come out TDQS_c. The relatively smaller crosstalk on the TDQS conductors will improve their signal integrity compared to DQS.

The re-routing of signals to available conductors may be done during construction of the information handling system, when tests show the conductors are susceptible to EMI. Alternatively, it may be done when the system is operating in its intended application.

Figure 8:
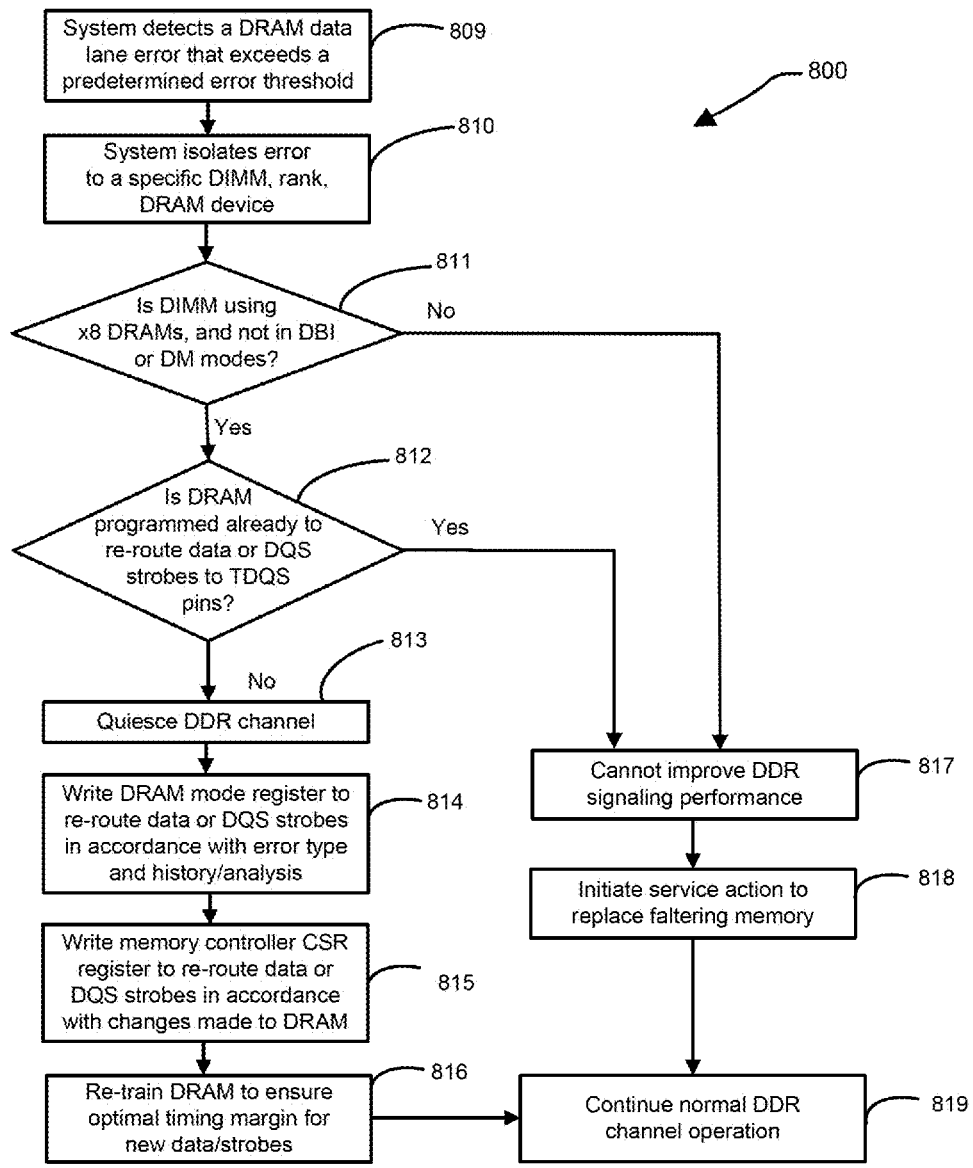
FIG. 8 is a flow diagram illustrating a method of handling error condition in DRAM.

FIG. 8 shows a method 800 for handling memory errors as they occur. The first step 809 is detecting the error or errors. Diagnostic routines may identify when errors occur, count them, and take action when the errors exceed some predetermined threshold. In the next step 810 the system isolates the source of the error, or the source of the worst of several errors. The diagnosis may identify which DIMM is at fault, which rank of DRAMS on the DIMM, and eventually the specific DRAM at fault. The next step 811 is a decision to determine if remediation is possible. The re-routing technique is only available for DRAMs with eight bit wide data paths, and only if the DRAM is not using the DBI or DM features. If that is all true, the path takes the yes branch to step 812, another decision. If not, the path goes to step 817. In step 812, if the identified DRAM has already re-routed signals onto the surplus conductors, no more surplus is available, and the path proceeds to step 817. If the DRAM still has available surplus conductors, the path proceeds to step 813.

At step 813 the remedy begins. This step turns off the data channel to the DRAM, quiescing it to stop operational transactions. The next step 814 writes mode registers in the DRAM to re-route the signals that make errors. As discussed earlier, a standard DDR4 memory will not have this mode register, but a memory in accordance with this disclosure will have this feature.

FIG. 9 shows an example of a mode register definition to show what it may contain. The rows show choices of what to put on the surplus TDQS; either no replacement, replace DQS, replace one data bit in DDR, or replace one data bit in single data rate (SDR). In this example, a code in bits 7-4 selects the action. A code in bits 2-0 selects which of the 8 data bits to replace.

Returning to FIG. 8, step 815 writes a corresponding mode register in the memory controller. The controller and DRAM substitutions must match. Step 816 re-trains the DRAM. This allows the DRAM to make minute timing adjustments, in order to capture data correctly. The controller may have a similar training period as it adjusts its internal timing. Then step 819 ends the path, and normal DRAM operations are resumed. Step 817 is where the path leads if no re-routing is possible. The next step 818 is to initiate a service request. The system may have a way to report the output of its diagnostic routines, and to request service to come and replace the DIMM with faults.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A system for improving memory performance, comprising:
   a memory device having a data pin and first and second available pins;
   a memory controller having a data pin coupled to the data pin of the memory device, having a first available pin coupled to the first available pin of the memory device, having a second available pin and having a differential signal pair data true (D_t) and data complement (D_c);
   a differential driver buffer in the memory controller, to drive signal D_t onto the first available pin of the controller and to drive signal D_c onto the second available pin of the controller as a differential pair; and
   a differential receiver in the memory device, to receive signal D_t on the first available pin of the memory device and to receive signal D_c on the second available pin of the memory device, as a differential pair;
   wherein the memory controller transfers memory data on the first available pin of the memory controller, and the memory device receives memory data on the first available pin of the memory device.

2. The system of claim 1, wherein the memory device is a dynamic random access memory (DRAM).

3. The system of claim 2, wherein the DRAM is a double data rate 4 DRAM.

4. The system of claim 2, wherein the memory controller is mounted on a motherboard of a server computer.

5. The system of claim 4, wherein the DRAM is mounted on a dual in-line memory module, the dual in-line memory module inserted into a socket on the motherboard.

6. The system of claim 3, wherein the first available pin is a termination data strobe true (TDQS_t) pin.

7. The system of claim 6, wherein the TDQS_t pin outputs data in double data rate mode.

8. The system of claim 1, further comprising a de-multiplexer to de-multiplex in time a double data rate data stream in the memory controller, to create a first single data rate stream output on the data pin of the memory controller, and to create a second single data rate stream output on the first available pin of the memory controller.

9. A method of improving performance of a memory system, the method comprising:
   identifying conductors that communicate signals to a memory device;
   analyzing an amount of shielding against crosstalk possessed by each one of the conductors, the analysis ranking the conductors from poorly shielded to better shielded;
   identifying which of the conductors are available in a desired mode of operation;
   ascertaining whether one of the available conductors in a desired mode is better shielded against crosstalk than a poorly shielded conductor that is being used in a desired mode; and
   if so, then connecting the signal of the poorly shielded conductor to the better shielded available conductor.

10. The method of claim 9, wherein the conductors are on a dual in-line memory module using double data rate 4.

11. The method of claim 9, wherein one of the available conductors in the desired mode is a termination data strobe complement pin.

12. The method of claim 9, wherein one of the available conductors in the desired mode is a termination data strobe true pin.

13. A method of error handling in a memory system, the method comprising:

detecting that errors on a data signal exceed a predetermined threshold;

isolating the data errors to a dual in-line memory module (DIMM) and a double data rate 4 dynamic random access memory (DRAM);

if the DRAM is eight bits wide, and the DIMM 1) is not using a data bus inversion feature, 2) is not using a data mask feature, and 3) is not already re-routing any signals, then:

quieting the DRAM;

writing a mode register in the DRAM to re-route the data signal or a data strobe signal to an available conductor;

writing a mode register in a memory controller connected to the DRAM to re-route the data signal or data strobe signal to the surplus conductor to match the DRAM; and re-training the DRAM to align timing on the available conductor.

14. The method of claim 13, wherein the re-routing comprises routing the data signal onto a conductor coupled to a termination data strobe true pin of the DRAM.

15. The method of claim 13, wherein the re-routing comprises de-multiplexing in time a double data rate data signal, to create a first single data rate signal routed onto a conductor that originally carried the double data rate data signal.

16. The method of claim 13, wherein the re-routing further creates a second single data rate data signal routed onto a conductor coupled to the termination data strobe true pin of the DRAM.

17. The method of claim 13, wherein the re-routing comprises routing the data strobe true signal onto a conductor coupled to the termination data strobe true pin of the DRAM.

18. The method of claim 13, wherein the re-routing further comprises routing a data strobe complement signal onto a conductor coupled to a termination data strobe complement pin of the DRAM.

* * * * *